United States Patent
Thompson, Jr. et al.

(10) Patent No.: US 6,705,095 B2
(45) Date of Patent: Mar. 16, 2004

(54) SEMICONDUCTOR PROCESS TOOL INCORPORATING HEAT EXCHANGER

(75) Inventors: Taylor Norris Thompson, Jr., Kingston, NY (US); Sanjiv Babubhai Patel, Bellingham, MA (US)

(73) Assignee: Kinetics Thermal Systems, Inc., Stone Ridge, NY (US)

( * ) Notice: Subject to any disclaimer, the term of this patent is extended or adjusted under 35 U.S.C. 154(b) by 0 days.

(21) Appl. No.: 10/094,500

(22) Filed: Mar. 8, 2002

(65) Prior Publication Data

US 2003/0167781 A1 Sep. 11, 2003

(51) Int. Cl.[7] .................................................. F25B 5/00
(52) U.S. Cl. ........................................ 62/117; 62/259.2
(58) Field of Search .............................. 62/117, 259.2, 62/498, 331, DIG. 10, 238.6

(56) References Cited

U.S. PATENT DOCUMENTS

| | | | |
|---|---|---|---|
| 5,604,446 A | * | 2/1997 | Sano ........................... 324/758 |
| 6,140,828 A | * | 10/2000 | Iino et al. .................... 324/758 |
| 6,334,311 B1 | * | 1/2002 | Kim et al. ..................... 62/3.2 |

FOREIGN PATENT DOCUMENTS

| JP | 2001334440 A | * | 12/2001 |
|---|---|---|---|

\* cited by examiner

Primary Examiner—Melvin Jones
(74) Attorney, Agent, or Firm—Lowrie, Lando & Anastasi, LLP

(57) ABSTRACT

The present invention is directed to heat exchangers for process tools and, in particular, to semiconductor process tools incorporating heat exchangers. In one embodiment, the present invention is directed to a semiconductor process tool heat exchange system. The system includes a heat exchange system and a semiconductor process tool comprising an inlet and an outlet defining a flow path. The heat exchange system includes a compressor fluidly connected to the outlet, a condenser fluidly connected to the compressor and to the inlet, an expander positioned between the condenser and the outlet, and a heat exchange fluid. Examples of process tools suitable for use in this system include cathodes, cold plates, thermal chucks, and the like. In another embodiment, the present invention is directed to a method of exchanging heat in a semiconductor process tool. The method includes supplying a condensed heat exchange fluid to the semiconductor process tool and expanding the condensed heat exchange fluid to an expanded heat exchange fluid within the semiconductor process tool. In another embodiment, the method includes supplying a compressed heat exchange fluid to the semiconductor process tool and condensing the compressed heat exchange fluid to a condensed heat exchange fluid within the semiconductor process tool. Thus, depending on the embodiment, the method is suitable for both cooling and heating a semiconductor process tool.

42 Claims, 3 Drawing Sheets

SEMICONDUCTOR PROCESS TOOL INCORPORATING HEAT EXCHANGER

FIELD OF THE INVENTION

The present invention is directed to heat exchangers for process tools and, in particular, to semiconductor process tools incorporating heat exchangers.

BACKGROUND OF THE INVENTION

Description of the Related Art

In the semiconductor industry, semiconductor chips are constructed in a series of steps with the use of semiconductor process tools. A semiconductor process tool, which will be hereinafter referred to as a "tool," is any device that is used to handle or treat a semiconductor or to monitor a property associated with the construction process. Common examples of tools are wafer chucks and cathodes.

Many of the processes carried out in semiconductor construction generate excess heat or require heat, necessitating the removal or addition of thermal energy from the tool and/or its surroundings. Accordingly, heat exchangers are common for use with tools. Typically, tools incorporating heat exchangers include an internal flow path containing a heat exchange liquid, such as a coolant or heating fluid, allowing the heat exchange liquid to contact the tool and provide the desired heat exchange.

Heat exchange liquid is typically supplied to the tool via flow paths extending from outside of a clean room where the tool is normally housed. The heat exchange liquid exiting the tool exchanges heat in a heat exchanger outside the clean room and is then returned to the tool. The flow rate and temperature of the heat exchange liquid are typically controlled to provide the desired degree of heating or cooling.

SUMMARY OF THE INVENTION

In one embodiment, the present invention is directed to a semiconductor process tool heat exchange system. The system includes a heat exchange system and a semiconductor process tool comprising an inlet and an outlet defining a flow path. The heat exchange system includes a compressor fluidly connected to the outlet, a condenser fluidly connected to the compressor and to the inlet, an expander positioned between the condenser and the outlet, and a heat exchange fluid.

In another embodiment, the present invention is directed to a semiconductor process tool heat exchange system. The system includes a heat exchange system and a semiconductor process tool comprising an inlet and an outlet defining a flow path and a heat exchange system. The heat exchange system includes a compressor fluidly connected to the inlet, an expander fluidly connected to the compressor and to the outlet, a condenser positioned between the compressor and the outlet, and a heat exchange fluid.

In another embodiment, the present invention is directed to a semiconductor process tool heat exchange system retrofit kit. The kit comprises a compressor adapted to fluidly connect to an outlet of a semiconductor process tool, a condenser fluidly connected to the compressor and adapted to be fluidly connected to an inlet of the semiconductor process tool, an expander adapted to be positioned between the condenser and the outlet, and a charge of heat exchange fluid.

In another embodiment, the present invention is directed to a method of exchanging heat in a semiconductor process tool. The method includes supplying a condensed heat exchange fluid to the semiconductor process tool and expanding the condensed heat exchange fluid to an expanded heat exchange fluid within the semiconductor process tool.

In another embodiment, the present invention is directed to a method of exchanging heat in a semiconductor process tool. The method includes supplying a compressed heat exchange fluid to the semiconductor process tool and condensing the compressed heat exchange fluid to a condensed heat exchange fluid within the semiconductor process tool.

BRIEF DESCRIPTION OF THE DRAWINGS

Preferred, non-limiting embodiments of the present invention will be described by way of example with reference to the accompanying drawings, in which.

DETAILED DESCRIPTION

Figure 1:
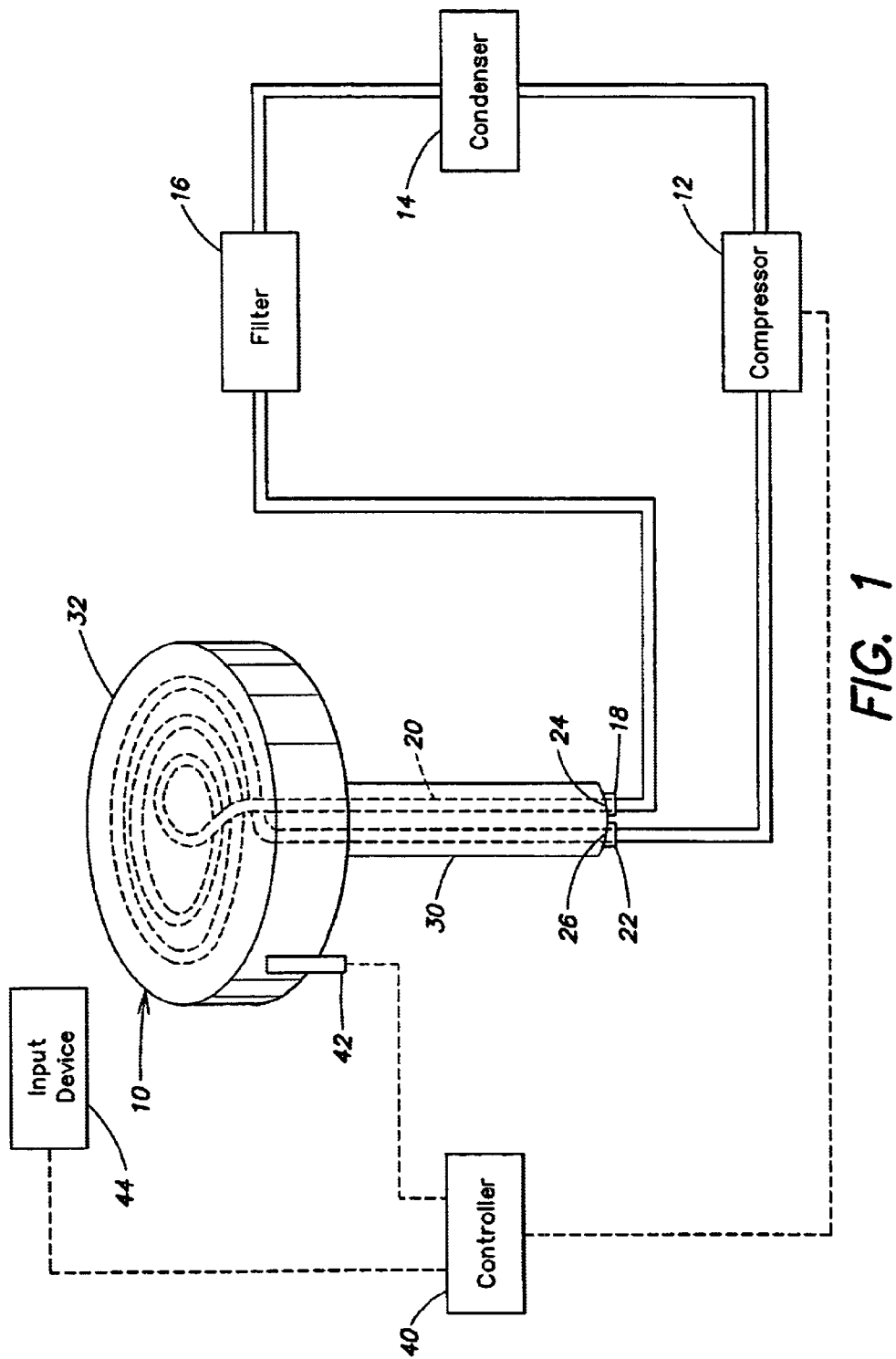
FIG. 1 is a schematic view of one embodiment of the present invention.

The present invention is directed to heat exchangers for process tools and, in particular, to a semiconductor process tool incorporating a heat exchanger. In the tool of the present invention, expansion or condensation of a heat exchange fluid occurs within the tool. As used herein, expansion includes at least some evaporation of the heat exchange fluid. Also as used herein, "heat exchange fluid" refers to any material or materials that may be expanded and condensed in a cycle to transfer heat from one location to another. Phase changes isothermally absorb or release relatively large amounts of thermal energy and are thus able to heat or cool with relatively small amounts of heat exchange fluid. Assuming constant pressure, evaporation occurs at a constant temperature, resulting in improved temperature uniformity over a single phase fluid. While a single phase fluid may increase in temperature as it absorbs heat from its surroundings, the heat exchange fluid of the present invention will maintain a constant hi. temperature as it changes phases. In some embodiments, pressure within the flow path may change as the heat exchange fluid expands or because of fluid resistance, but such pressure changes are typically negligible.

In addition to improved uniformity, expanding or condensing the heat exchange fluid within the tool removes an intermediate step of cooling or heating a heat exchange liquid with a heat exchange fluid. The removal of this intermediate step improves the efficiency of the heat exchange, allowing a smaller heat exchange system to transfer the same amount of thermal energy. As space is typically at a premium in the clean rooms used in the semiconductor industry, use of this smaller heat exchange system in the clean room represents a significant advantage. The smaller heat exchange system may also allow the heat exchange system, or components thereof, to be positioned on or within the tool itself. Moving all of the components of the heat exchange system into the proximity of the tool reduces the potential for heat exchange between the heat exchange fluid and the environment as the heat exchange fluid flows to and from the tool. This reduction in the distance that the heat exchange fluid travels may also reduce the potential for leaks, which have been a problem where traditional heat exchange liquid is used. Additionally, the effects of a heat exchange fluid leak may have less harmful effects than a leak of heat exchange liquid.

In one embodiment, a semiconductor process tool heat exchange system includes a semiconductor process tool having an inlet and an outlet defining a flow path. The system further comprises a heat exchange system including a compressor fluidly connected to one of the inlet and the outlet, a condenser fluidly connected to the compressor, and an expander fluidly connected to the compressor. As used herein, "fluidly connected" means connected in a manner that allows fluid communication. Fluidly connected does not imply a direct connection between objects. For example, two objects may be fluidly connected by a fluid path. Furthermore, a device (or devices) that does not prevent fluid flow, such as a filter, may be positioned between objects that are fluidly connected.

Referring now to the figures, and, in particular, to FIG. 1, an example embodiment of the present invention will be described. In the embodiment illustrated in FIG. 1, a semiconductor process tool heat exchange system includes a semiconductor process tool 10 including an inlet 24 and an outlet 26, defining a flow path 20. The system further comprises a heat exchange system, including a compressor 12 fluidly connected to one of inlet 24 and outlet 26, a condenser 14 fluidly connected to compressor 12, and an expander 18 fluidly connected to compressor 12.

In an embodiment of the invention where it is desired to cool tool 10, condensed heat exchange fluid may pass into flow path 20 through inlet 24. At some point between condenser 14 and outlet 26, the condensed heat exchange fluid may pass through expander 18, at least partially expanding the heat exchange fluid to a gas and absorbing energy from tool 10. The expanded heat exchange fluid may then pass through outlet 26 to compressor 12, where it may be compressed. Finally, the compressed heat exchange fluid may pass from compressor 12 to condenser 14, where it may be condensed and the cycle repeated.

The heat exchanger of the present invention is generally illustrated herein as removing heat from tool 10, however, it should be appreciated that the present system is easily adapted to deliver heat to tool 10. In embodiments where it is desired to heat tool 10, the cycle described above may be reversed. Specifically, compressed gas may be condensed within flow path 20 of tool 10, rather than expanded. To complete the cycle, the condensed gas may then be expanded by an expander, compressed in a compressor and returned to flow path 20 for condensation.

In certain embodiments of the present invention, a tool designed to be cooled with a heat exchange liquid may be retrofitted to operate with a heat exchange fluid according to the present invention. In such an embodiment, the components of the heat exchange system may connect to the tool where the tool would normally connect to a supply of heat exchange liquid. Traditional tools using heat exchange liquid typically have a 2–3° C. temperature differential between the tool and the heat exchange liquid. To provide the same cooling and temperature profile in the tool as the heat exchange liquid, it is preferred that the temperature differential between the heat exchange fluid and tool be similar to that between heat exchange liquid and tool. Complete expansion of the heat exchange fluid may result in a dramatic drop in temperature, making maintenance of this relatively small temperature differential difficult. Accordingly, the expansion of the heat exchange fluid may be controlled to provide a desired temperature differential.

For example, a restrictor 22 may be used to inhibit expansion of the gas. In some embodiments, several restrictors 22 may be used to expand the gas in stages to provide a desired temperature profile within flow path 20, such as one mimicking the temperature profile produced by a heat exchange liquid.

A heat exchanger wherein a heat exchange fluid has only been partially expanded is referred to herein as a "flooded heat exchanger" and is described as being operated in a "flooded condition." Where the heat exchanger of the present invention is operated as a flooded heat exchanger, the desired degree of expansion of the heat exchange fluid may vary with the specific embodiment. For example, depending on the embodiment, it may be desired to expand less than half of the heat exchange fluid by weight, less than 25% of the heat exchange fluid by weight, or less than 5% of the heat exchange fluid by weight.

Heat exchange operating parameters, such as the degree of expansion of heat exchange fluid, the flow rate of heat exchange fluid, and the location of expansion and/or restriction of the heat exchange fluid, may be adjusted to meet particular cooling specifications. For example, adjustment of the operating parameters may depend on cooling specifications such as the desired temperature profile of the tool, the desired temperature differential between the heat exchange fluid and tool, the amount of heat to be exchanged, the configuration of the flow path, and the like. The selection of these operating parameters given a particular set of cooling specifications is within the skill of an ordinary artisan.

The heat exchange fluid used in the present invention may be any heat exchange fluid compatible with flow path 20 and capable of providing the desired cooling. Typically, heat exchange fluids are rated for a particular temperature range in which they are capable of efficiently transferring heat. Accordingly, selection of a particular heat exchange fluid may be based upon the temperature ranges involved. Heat exchange fluids that may be suitable for particular embodiments include SUVA® HP-62 and SUVA® R-134a refrigerants manufactured by DuPont (Wilmington, Del.), which are useful for cooling to about −40° and −15° C., respectively, and Genetron® AZ-50 manufactured by Allied Corporation (Morris Township, N.J.), which is useful for cooling to about −40° C. It should be understood that these temperature ranges are provided by way of example and that other temperature ranges may be suitable for some embodiments. For example, where lower temperatures are desired, other refrigerants could be used, and/or cascade, autocascade, or multistage refrigeration systems could be employed. In some embodiments, depending on the nature of tool 10, the heat exchange fluid may be dielectric, meaning that its is substantially non-conductive to electricity. Preferably, heat exchange fluids contain no chlorofluorocarbons (CFCs).

The semiconductor process tool heat exchange system of the invention will now be further described with reference to its construction. Tool 10 may be any device used to treat or handle a semiconductor. For example, tool 10 may be a device that supports a semiconductor wafer, moves a wafer, applies a material to a wafer, senses a condition relevant to the semiconductor construction process, or the like. In one embodiment, tool 10 may be any portion of a vacuum apparatus used in a semiconductor manufacturing process. Common tools that may incorporate heat exchangers include chucks and cathodes.

Figure 3:
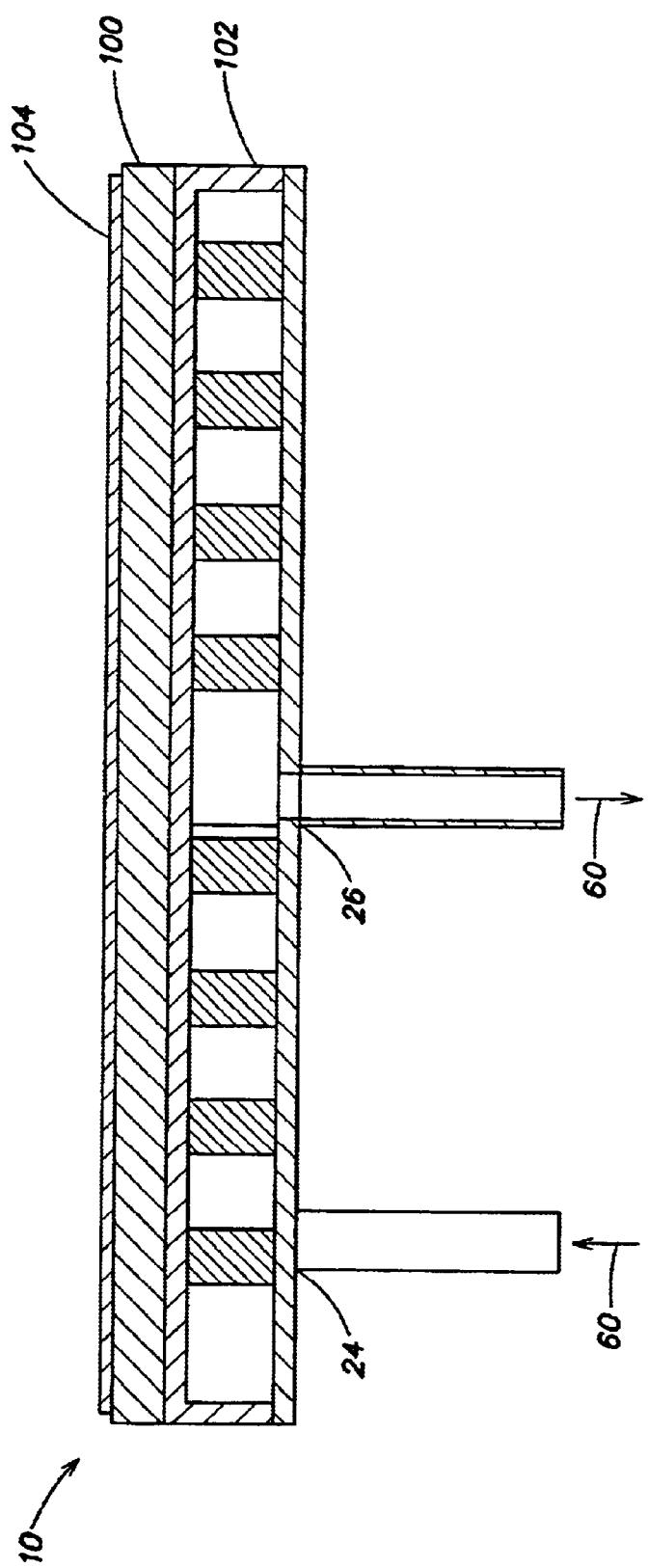
FIG. 3 is a cross-sectional view of another embodiment of the present invention.

Chucks are tools typically used to support a semiconductor wafer during various treatments. Chucks may be capable of holding the wafer in place during treatment. For example, electrostatic chucks are capable of holding a wafer in place using electrostatic force. Chucks may require heating or cooling depending on the application. Some chucks are heated with isolated heating elements or infrared radiation, either of which could potentially be replaced with a heat exchanger according to the present invention. In some embodiments, chucks may contain both a heater and a fluid path for heating or cooling according to the present invention. Chucks cooled with a heat exchange liquid may be replaced or retrofitted to work with the present invention as has already been described. FIG. 1 illustrates a chuck adapted to operate according to the present invention. FIG. 3 illustrates an alternate embodiment of a chuck, where the chuck 100 is in contact with a cold plate, or hot plate, 102. A work piece 104 is illustrated on chuck 100.

Figure 2:
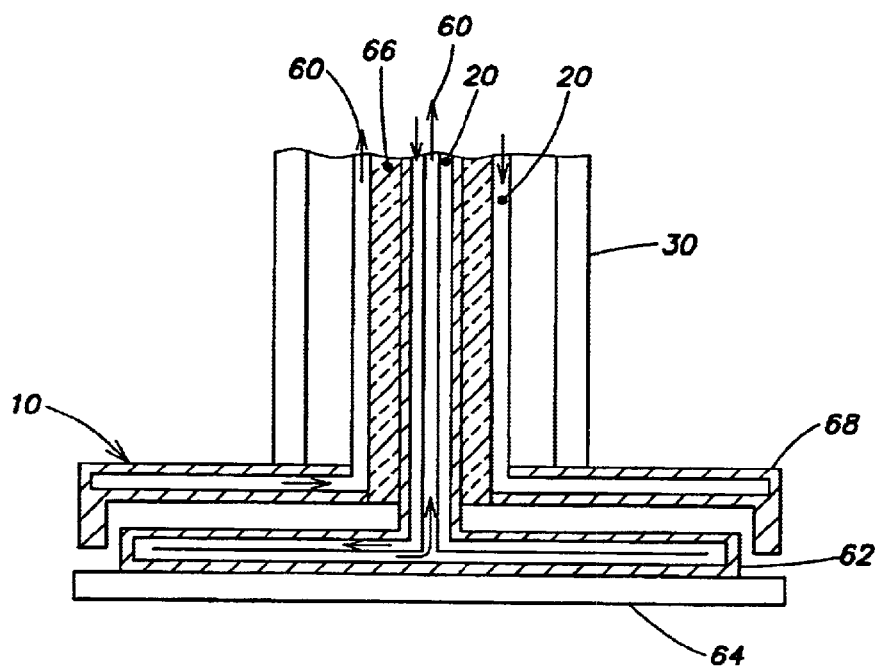
FIG. 2 is a cross-sectional view of another embodiment of the present invention.

Cathodes, another common tool, support treating material as a semiconductor material is treated in vacuum processes such as sputtering, etching, deposition, stripping, and the like. Cathodes typically require cooling. FIG. 2 illustrates a conventional cathode. In the cathode of FIG. 2, a dielectric target 62 rests on a radio frequency (rf) electrode 64 in a spaced relation to a grounded shield 68. Arrows 60 indicate the flow of heat exchange fluid though flow paths 20, some of which are surrounded by an insulator 66. It should be appreciated that in some embodiments, such as the embodiments of FIGS. 2 and 3, it may be possible to reverse the inlet and outlet such that the direction of flow of heat exchange fluid is reversed.

Flow path 20 may be constructed in any manner and using any materials that allow flow path 20 to provide contact between the heat exchange fluid and tool 10. For example, flow path 20 may be a flow path originally constructed to operate with a heat exchange liquid and may be lined with a material or may simply be a flow path formed out of the bulk material from which tool 10 is constructed. In some embodiments, flow path 20 may include a tube, such as a capillary, that fits within a larger pathway through tool 10. Such an arrangement may be used to retrofit an existing tool to use heat exchange fluid, though it is not required for a successful retrofit, nor would such an arrangement be limited to use in a retrofit. This arrangement may also allow expanders 18 or restrictors 22 to be more easily positioned within tool 10, as they may be positioned within flow path 20 and then flow path 20 may be inserted into a pathway through tool 10. In one embodiment, a smaller flow path is positioned within a larger flow path, and the smaller flow path is perforated by holes, orifices, or the like. Such orifices may allow restricted flow into the larger flow path, thus providing expansion into the larger flow path. The position and number of orifices may be selected to provide a desired temperature profile. Flow path 20 may have any configuration and cross sectional shape that provides the desired heat exchange. A typical capillary that may be used for this purpose is of generally circular cross-section and has an inner and outer diameter in the order of several hundredths of an inch.

Flow path 20 may be constructed of any material that allows sufficient heat transfer to provide the desired heat exchange, and is not adversely affected by the presence of the heat exchange fluid. For example, flow path 20 may be constructed of a material that is relatively inert in the presence of the heat exchange fluid and is a good conductor of thermal energy. Common materials that are good conductors and compatible with the use of many heat exchange fluids include copper and aluminum. Copper and aluminum are also ductile and may be shaped as desired. In some embodiments, the material of construction of flow path 20 may be the material of construction of a flow path designed to be used with a heat exchange liquid rather than a heat exchange fluid, such as where an existing tool is retrofitted. As mentioned above, flow path 20 may be formed directly out of tool 10 and, thus, may be constructed of a ceramic, metal or other material from which tool 10 is constructed. Where it is desired to insert flow path 20 into a larger pathway, flow path 20 may be flexible to facilitate insertion. For example, flow path 20 may be constructed out of a flexible polymeric material.

Inlet 24 and outlet 26 may be constructed in any manner that allows heat exchange fluid to be introduced and removed from flow path 20. For example, inlet 24 and outlet 26 simply may be the exit and entry of flow path 20 through tool 10 and may have no structure apart from this. However, it is preferred that inlet 24 and outlet 26 include structure to form a fluid tight seal with a supply of heat exchange fluid. As the heat exchange fluid undergoes at least a partial phase change within flow path 20, inlet 24 and outlet 26 may be both gas-tight and liquid-tight. For example, inlet 24 and outlet 26 may comprise a gas and liquid tight fitting. Inlet 24 and outlet 26 may also include structure that allows them to be quickly connected and disconnected to a source of heat exchange fluid while allowing little or no heat exchange fluid to escape to the environment. For example, inlet 24 and outlet 26 may include quick-connects that allow rapid and substantially fluid-tight connection and disconnection between flow path 20 and a source to heat exchange fluid. One type of quick-connect includes mating structure on inlet 24 or outlet 26 and a fluid path carrying heat exchange fluid. Each mating structure may include a one-way valve that prevents fluid from escaping from fluid path 20 and/or the source of heat exchange fluid and that is displaced and opened as the two are connected. Swagelok Company of Solon, Ohio makes a variety of quick-connects that may be suitable for particular embodiments.

Compressor 12 may be any device or system capable of pressurizing a gas. For example, an appropriately sized conventional compressor designed for a traditional refrigeration system may be used. Where the atmosphere around compressor 12 may be combustible or corrosive, compressor 12 may be constructed to prevent electrical components that may spark from contacting the atmosphere and may be housed within or constructed from a material that is resistant to the corrosive condition. Compressors that may be used in a typical semiconductor application include hermetic compressors, such as Danfoss (Baltimore, Md.) model TFS4.5CLX or Copeland (Sidney, Ohio) model RS97C1E-TFC; semi hermetic compressors, such as Copeland model KATB-015E-CAV; scroll compressors, such as Copeland model ZF06K4E-TFD; and digital scroll compressors. In one embodiment, a variable rate screw compressor or a variable displacement compressor, such as a scroll compressor, may be used and may arranged to provide process control. For example a variable rate or variable displacement compressor may control the temperature by varying the pressure of the heat exchange fluid.

Condenser 14 may be any device or system capable of condensing a gas. For example, an appropriately sized conventional condenser designed for a traditional refrigeration system may be used. Condenser 14 may include a volume to contain uncondensed gas and a may be in contact with an environment to which heat may be transferred, such as the clean room environment. Such transfer may be assisted by the presence of structure that increases the effective surface area for heat transfer, such as heat fins.

Condensers that may be used for this purpose include air and water cooled condensers. Examples of water cooled condensers include tube-in-tube condensers such as Packless (Waco, Tex.) model COAX-2600-S, and shell and tube condensers such as Packless models SST-750 and VSE-2, which are horizontal and vertical, respectively. Suitable air cooled compressors may be available from Super Radiator Coils of Chaska, Minn.

Expander 18 may be constructed in any manner that allows it to at least partially expand a heat exchange fluid from a liquid to a gas. For example, expander 18 may be designed to create a drop in pressure sufficient to expand a liquid heat exchange fluid to a gaseous heat exchange fluid. Expander 18 may take the form of an orifice, nozzle, expansion valve, or the like, and may be a conventional device used for expansion in refrigeration systems. Expander 18 may be sized to provide a desired level of expansion. For example, the pressure drop may be selected to provide a desired level of expansion.

Expander 18 may be positioned anywhere between condenser 14 and outlet 26 of flow path 20. For example, heat exchange fluid may be expanded prior to entering flow path 20, upon entering flow path 20, or at some point within flow path 20. Preferably, expansion occurs as close as possible to the point where heat is desired to be exchanged. For example, where, as illustrated in FIG. 1, tool 10 includes a pedestal 30 and a support 32, and heat exchange is desired at support 32, expander 18 may be positioned such that expansion occurs at support 32. In such an embodiment, expander 18 may be positioned within flow path 20 where flow path 20 passes from pedestal 30 to support 32. In other embodiments, where it is desired to use an existing flow path or to provide ready access to expander 18, it may be preferred that expander 18 be located at inlet 24, regardless of where heat exchange is desired. It should be understood that, while it may be preferred for simplicity or ease of access to position expander 18 at or near inlet 24, that expander 18 may be inserted further into flow path 20. For example, in one embodiment, expander 18 may be positioned along flow path 20 and flow path 20 may be inserted into an existing flow path to position expander 18 where desired.

Compressor 12 typically pulls heat exchange fluid into it for compression, potentially resulting in a low pressure condition in flow path 20 and inhibiting controlled expansion of the heat exchange fluid. Accordingly, in one embodiment, the tool incorporating a heat exchanger of the present invention may include structure to maintain sufficient pressure within flow path 20 to control expansion of heat exchange fluid and provide a desired temperature profile. The structure designed to control expansion of heat exchange fluid may comprise a restrictor 22. Restrictor 22 may be any device or system that maintains pressure within flow path 20. For example, restrictor 22 may include a valve, orifice, nozzle, or the like. Restrictor 22 may be structurally identical to expander 18. Furthermore, as the pressure in flow path 20 downstream of restrictor 22 will typically be lower than that upstream of restrictor 22, restrictor 22 may effectively act as an expander 18.

As with expander 18, restrictor 22 may be positioned as dictated by convenience and/or heat exchange requirements. For example, restrictor 22 may be placed at or near outlet 26 to facilitate retrofitting an existing flow path and/or to provide ready access to restrictor 22. As described with respect to expander 18, restrictor 22 need not be located at outlet 26, and may be positioned within flow path 20 as desired. For example, in some embodiments, the dual restrictor/expander function of restrictor 22 may be used to provide a desired temperature profile. To illustrate, a first portion of heat exchange fluid may undergo controlled expansion in a first portion of flow path 20 between expander 18 and restrictor 22. A second portion of heat exchange fluid may then undergo expansion in a second portion of flow path 20 between restrictor 22 (now acting as an expander) and a second restrictor. This pattern could be repeated with additional expanders/restrictors as desired or until all of the heat exchange fluid is expanded. The relative pressure drops across each of the expander/restrictors could be selected to provide the desired heat exchange in each portion of flow path 20, allowing any temperature profile to be created. For example, several expanders/restrictors may be spaced throughout flow path 20 to provide even heat exchange throughout flow path 20. In this example, the more expanders/restrictors that are used, the more even the heat exchange is likely to be.

In some embodiments, it may be desired to protect flow path 20 and the other components of the heat exchanger from damage or malfunction caused by contaminants. Accordingly, structure may be introduced into the heat exchange system to remove contaminants from the heat exchange fluid. For example, a filter 16 may be placed along a flow path carrying heat exchange fluid. Preferably, filter 16 is positioned in a portion of the heat exchange system where the heat exchange fluid is a liquid so that any contaminants may be carried within the heat exchange fluid to filter 16. Most preferably, filter 16 is positioned near where expansion will take place, such as between condenser 14 and expander 18, so that any contaminants may be removed prior to expansion. Filter 16 may be positioned where it may be readily accessed for cleaning, replacement, or other maintenance.

Filter 16 may be constructed in any manner and using any materials compatible with the heat exchange fluid and able to provide the desired contaminant removal. For example, filter 16 may be constructed of a material capable of filtering particles and/or moisture, and, in some embodiments, very fine particles. One suitable filter is a liquid line filter drier such as Alco (St. Louis, Mo.) model ALF-032. The economics of semiconductor processes are typically very sensitive to down time. According, filter 16 may be capable of running for a relatively long period without being changed or cleaned, or may be capable of being changed or cleaned while the process is running. For example, a bypass line may be used to divert fluid from filter 16 while it is cleaned.

The semiconductor process tool heat exchange system of the present invention may include a controller 40. Controller 40 may be any device or system capable of receiving a signal from the heat exchange system and providing a signal to the heat exchange system. For example, controller 40 may receive signals from one or more sensors associated with the heat exchange system and may provide signals to one or more control mechanisms associated with the heat exchange system, such as valves, compressors, and the like.

Signals sent by controller 40 to the heat exchange system may be related to signals received from the heat exchange system. For example, a particular signal from a sensor may prompt controller 40 to provide a particular signal to a control mechanism. To illustrate, a signal from a temperature sensor 42, such as a thermocouple, indicating an above-specification temperature may prompt controller 40 to provide a signal to compressor 12, increasing its operation. In an alternate example, a signal my prompt action by a bypass valve, diverting a portion of the heat exchange fluid. Such a bypass valve may be any valve or other mechanism capable of diverting heat exchange fluid rapidly and accurately enough for a particular application. For example, a proportioning solenoid valve may be used in some embodiments.

In one embodiment using a bypass, a portion of the heat exchange fluid may be diverted away from the flow path. Accordingly, temperature may be controlled by controlling how much heat exchange fluid is supplied to the flow path. In another embodiment using a bypass, a portion of the heat exchange fluid that has already passed through the flow path may be recycled directly to the flow path. Because this recycled heat exchange fluid has already exchanged heat, it may reduce the total heat exchange capacity of the heat exchange fluid entering the flow path. Accordingly, temperature may be controlled by adjusting the amount of reduced capacity heat exchange fluid recycled.

In another example, controller 40 may provide a signal to a bucking system to control the temperature of the tool. By "bucking system," it is meant any apparatus or system that provides heat exchange competing with the heat exchange system of the present invention. For example, where the present invention is used for cooling, a heater may be used as a bucking system. Such a heater may be any system capable of providing heat to the tool, such as a heat exchange system according to the present invention or a conventional heater for the tool, such as a heater operating by electrical resistance, or other heater known in the art.

Controllers may receive more than a single signal. For example, multiple temperature sensors could be used, allowing the temperature to be monitored in multiple locations. Such an arrangement may be used to verify a desired temperature profile in the tool. Controller 40 may also receive signals from more than one type of sensor. For example, controller 40 may receive signals from a pressure transducer as well as a temperature sensor.

Controller 40 may receive signals from outside of the heat exchange system and may also send signals outside the heat exchange system. For example, controller 40 may receive inputs from one or more input devices 44. Input device 44 may include any device or system capable of receiving an input from outside the heat exchange system and providing a signal to controller 40 based upon that input. For example, input device 44 may be a potentiometer, key pad or Supervision Control And Data Acquisition (SCADA) node. Controller 40 may provide output signals to other devices in the semiconductor manufacturing line or may provide output signals to a device that may provide information to a human operator, such as an alarm or visual monitor.

Controller 40 may be constructed in any manner that allows it to receive signals and transmit signals based on the received signals. For example, controller 40 may include an analog or digital processor, and, in a preferred embodiment, is a microprocessor based device such as a central processing unit (CPU) with memory, like a programmable logic controller (PLC).

In one embodiment, the semiconductor heat exchange system of the present invention is capable of providing a desired temperature resolution and stability to tool 10. For example, the semiconductor heat exchange system may be capable of sufficiently fine adjustment and may be sufficiently free of undesired temperature fluctuations for a particular application. For example, a temperature resolution of 0.3° C. with a ±0.3° C. stability may be desirable in some embodiments. In other embodiments, a temperature resolution of 0.1° C. with a ±0.1° C. stability may be preferred. The resolution and stability need not match in every embodiment. Where the heat exchange system of the present invention replaces a conventional heat exchange system using heat exchange liquid, it may have a resolution and stability at least equal to that of the conventional system that it replaces.

In one embodiment, the semiconductor process tool heat exchange system of the present invention provides heat exchange for more that one tool. For example, the heat exchange system may provide cooling to several tools with one compressor and one condenser supplying heat exchange fluid to each of the tools. In such an embodiment, the heat exchange fluid may be delivered to the tools using a manifold and a valve or valves, optionally connected to a controller. In another embodiment, the heat exchange fluid may be fed to multiple tools in series, with a portion of the heat exchange fluid changing phase in each tool. Where tools requiring heating and tools requiring cooling may be located in the same vicinity, the same heat exchange fluid may be expanded in the tool(s) requiring cooling and condensed in the tool(s) requiring heating.

The semiconductor process tool heat exchange system of the present invention may have redundant systems to improve its reliability. For example, as already mentioned, multiple filters may be included so that heat exchange fluid may be diverted to another filter when one becomes blocked or it is otherwise undesirable to use it. Other portions of the heat exchange system could be similarly duplicated. For example, a back-up compressor may be included in case of a problem with the first compressor. The condenser and controller may be similarly duplicated. In some embodiments, such as where there may be a problem with clogging of the flow path through the tool, it may be desired to have a second inlet and outlet connected by a second flow path. Such a flow path may be supplied with heat exchange fluid by the same heat exchange system or a separate system.

In addition to having utility as a back-up system, an additional flow path or paths through the tool may provide additional heat transfer capacity or may be used to provide different zones for heating or cooling. For example, it may be advantageous to cool portions of the tool for only some of a process while cooling other portions throughout the process. If they are cooled by a separate flow path, flow to the portions not requiring constant cooling may be reduced or ceased at the appropriate time. Flow of heat exchange fluid to multiple flow paths may be accomplished in any manner able to control the flow as desired. For example, manifold or multiple compressor systems, such as described above, may be used in such an embodiment.

It will be understood that each of the elements described herein, or two or more together, may be modified or may also find utility in other applications differing from those described above. While particular embodiments of the invention have been illustrated and described, it is not intended to be limited to the details shown, since various modifications and substitutions may be made without departing in any way from the spirit of the present invention as defined by the following claims.

What is claimed is:

1. A semiconductor process tool heat exchange system, comprising:
    a first semiconductor process tool comprising a first inlet and a first outlet defining a first flow path; and
    a heat exchange system, comprising:
    a compressor fluidly connected to the first outlet,
    a condenser fluidly connected to the compressor and to the first inlet,
    an expander positioned between the condenser and the first outlet, and
    a heat exchange fluid.

2. The semiconductor process tool heat exchange system of claim 1, further comprising:
a second semiconductor process tool comprising a second inlet and a second outlet defining a second flow path;
wherein the compressor is fluidly connected to the second outlet, the condenser fluidly connected to the compressor and to the second inlet, and the expander positioned between the condenser and the second outlet.

3. The semiconductor process tool heat exchange system of claim 1, wherein the expander comprises an expansion valve.

4. The semiconductor process tool heat exchange system of claim 1, wherein the expander is positioned at the first inlet.

5. The semiconductor process tool heat exchange system of claim 1, further comprising a plurality of expanders positioned in a spaced relation along the first flow path.

6. The semiconductor process tool heat exchange system of claim 1, further comprising a restrictor positioned between the expander and the compressor.

7. The semiconductor process tool heat exchange system of claim 6, wherein the restrictor is positioned at the first outlet.

8. The semiconductor process tool heat exchange system of claim 6, further comprising a plurality of restrictors positioned in a spaced relation along the first flow path.

9. The semiconductor process tool heat exchange system of claim 1, further comprising a filter positioned between the condenser and the first inlet.

10. The semiconductor process tool heat exchange system of claim 1, wherein at least some of the heat exchange fluid is positioned within the first flow path and the heat exchange fluid positioned within the first flow path comprises a gaseous portion and a liquid portion.

11. The semiconductor process tool heat exchange system of claim 10, wherein the liquid portion comprises a greater mass of the heat exchange fluid than the gaseous portion.

12. The semiconductor process tool heat exchange system of claim 11, wherein the liquid portion comprises at least 75% of the total mass of heat exchange fluid positioned within the first flow path.

13. The semiconductor process tool heat exchange system of claim 12, wherein the liquid portion comprises at least 95% of the total mass of heat exchange fluid positioned within the first flow path.

14. The semiconductor process tool heat exchange system of claim 1, wherein the heat exchange fluid is a dielectric material.

15. The semiconductor process tool heat exchange system of claim 1, wherein the first inlet and first outlet of the first flow path each comprise a quick-connect.

16. The semiconductor process tool heat exchange system of claim 1, wherein the first semiconductor process tool comprises a wafer chuck.

17. The semiconductor process tool heat exchange system of claim 1, wherein the first semiconductor process tool comprises a cathode.

18. The semiconductor process tool heat exchange system of claim 1, further comprising:
a control system comprising:
a sensor,
a control mechanism, and
and a controller in communication with the sensor and the control mechanism.

19. The semiconductor process tool heat exchange system of claim 18, wherein the sensor comprises a temperature sensor.

20. The semiconductor process tool heat exchange system of claim 18, wherein the control mechanism comprises the compressor.

21. The semiconductor process tool heat exchange system of claim 20, wherein the compressor comprises a variable displacement compressor.

22. The semiconductor process tool heat exchange system of claim 20, wherein the compressor comprises a variable speed compressor.

23. The semiconductor process tool heat exchange system of claim 18, wherein the control mechanism comprises a valve.

24. A semiconductor process tool heat exchange system, comprising:
a semiconductor process tool comprising an inlet and an outlet defining a flow path; and
a heat exchange system, comprising:
a compressor fluidly connected to the inlet,
an expander fluidly connected to the compressor and to the outlet,
a condenser positioned between the compressor and the outlet, and
a heat exchange fluid.

25. The semiconductor process tool heat exchange system of claim 24, wherein at least some of the heat exchange fluid is positioned within the flow path and the heat exchange fluid positioned within the flow path comprises a gaseous portion and a liquid portion.

26. The semiconductor process tool heat exchange system of claim 25, wherein the gaseous portion comprises a greater mass of the heat exchange fluid than the liquid portion.

27. The semiconductor process tool heat exchange system of claim 26, wherein the gaseous portion comprises at least 75% of the total mass of heat exchange fluid positioned within the flow path.

28. The semiconductor process tool incorporating a heat exchanger of claim 27, wherein the gaseous portion comprises at least 95% of the total mass of heat exchange fluid positioned within the flow path.

29. A semiconductor process tool heat exchange system kit, comprising:
a compressor adapted to fluidly connect to an outlet of a semiconductor process tool;
a condenser fluidly connected to the compressor and adapted to be fluidly connected to an inlet of the semiconductor process tool;
an expander adapted to be positioned between the condenser and the outlet; and
a charge of heat exchange fluid.

30. A method of exchanging heat in a semiconductor process tool, comprising:
supplying a condensed heat exchange fluid to the semiconductor process tool; and
expanding the condensed heat exchange fluid to an expanded heat exchange fluid within the semiconductor process tool.

31. The method of claim 30, wherein only a portion of the condensed heat exchange fluid is expanded to an expanded heat exchange fluid within the semiconductor process tool.

32. The method of claim 30, further comprising restricting the expansion of the condensed heat exchange fluid.

33. The method of claim 32, further comprising expanding the condensed heat exchange fluid in stages.

34. The method of claim 30, further comprising compressing the expanded heat exchange fluid to produce a compressed heat exchange fluid.

35. The method of claim 34, further comprising condensing the compressed heat exchange fluid to produce the condensed heat exchange fluid.

36. The method of claim 35, further comprising filtering the condensed heat exchange fluid.

37. A method of exchanging heat in a semiconductor process tool, comprising:

supplying a compressed heat exchange fluid to the semiconductor process tool; and condensing the compressed heat exchange fluid to a condensed heat exchange fluid within the semiconductor process tool.

38. The method of claim 37, wherein only a portion of the compressed heat exchange fluid is condensed to a condensed heat exchange fluid within the semiconductor process tool.

39. The method of claim 37, further comprising condensing the compressed heat exchange fluid in stages.

40. The method of claim 37, further comprising expanding the condensed heat exchange fluid to produce an expanded heat exchange fluid.

41. The method of claim 40, further comprising compressing the expanded heat exchange fluid to produce the compressed heat exchange fluid.

42. The method of claim 37, further comprising filtering the condensed heat exchange fluid.

* * * * *